(12) United States Patent
Berry

(10) Patent No.: US 7,187,233 B1
(45) Date of Patent: Mar. 6, 2007

(54) FLOATING BRIDGE AMPLIFIER SYSTEM

(76) Inventor: Joseph Norman Berry, 918 Jami Ct., Lawrenceville, GA (US) 30045

(*) Notice: Subject to any disclaimer, the term of this patent is extended or adjusted under 35 U.S.C. 154(b) by 70 days.

(21) Appl. No.: 11/039,037

(22) Filed: Jan. 20, 2005

Related U.S. Application Data

(60) Provisional application No. 60/538,029, filed on Jan. 21, 2004.

(51) Int. Cl.
*H03F 3/00* (2006.01)
*H03F 3/217* (2006.01)

(52) U.S. Cl. .................. 330/146; 330/207 A; 330/251

(58) Field of Classification Search ..................... None
See application file for complete search history.

(56) References Cited

U.S. PATENT DOCUMENTS

| | | |
|---|---|---|
| 2,828,369 A | 3/1958 | Wiggins |
| 4,586,000 A | 4/1986 | Wagner |
| 5,003,271 A * | 3/1991 | Swanson ..................... 330/146 |
| 6,242,977 B1 | 6/2001 | Karsten |
| 6,396,340 B1 * | 5/2002 | Schmitt et al. ............. 330/146 |
| 6,747,513 B1 | 6/2004 | Berry |

* cited by examiner

*Primary Examiner*—Khanh Van Nguyen

(57) ABSTRACT

An audio amplifier system includes at least a pair of DC power supplies, a floating bridge current gain output section, and a differential voltage gain input section that draws operating current from the DC power supplies through floating DC current regulators. The included current regulators reject power supply noise and modulation and provide a floating current path for establishing positive and negative operating voltages for the voltage gain section. Cross-coupled interstage loading enables nearly rail-to-rail output voltage swing while providing local feedback around the output section for reduced distortion and improved output load control. The floating current regulators in the circuit exhibit enhanced performance as a result of suppressed operating voltage fluctuations.

19 Claims, 2 Drawing Sheets

FLOATING BRIDGE AMPLIFIER SYSTEM

CROSS-REFERENCE TO RELATED APPLICATIONS

This application is entitled to the benefit of Provisional Application Ser. No. 60/538,029 filed Jan. 21, 2004.

BACKGROUND OF THE INVENTION

This invention relates to amplifiers, and more specifically, to a high fidelity audio amplifier or preamplifier system incorporating a floating bridge circuit topology.

A floating bridge or "circlotron" amplifier includes a floating bridge output section in which a pair of voltage follower devices or circuits and a pair of floating DC power supplies are arranged as a balanced bridge. Practical amplifier systems of this type also generally include a preceding voltage gain section to raise an applied input signal voltage to the required output level and to supply a differential drive signal to the output section. Ideally, the included voltage gain section provides linear gain over a wide range, has ground-referenced input terminals to allow for direct coupling of a signal source, and is simple and inexpensive to implement. A long-tail pair differential amplifier meets these criteria, and can be combined with a floating bridge output section to form an inherently linear amplifier system. Such an amplifier system is highly desirable, as it obviates the need for large amounts of global negative feedback to reduce amplifier distortion. It is known in the art that heavy use of global negative feedback can lead to poor transient response, marginal stability, and increased high-order residual distortion products, all of which can degrade perceived amplifier sound quality.

Although floating bridge amplifier systems have been used successfully in audio applications in the past, much room remains for improvement of this topology. Significant drawbacks and limitations of previous embodiments include:

a) The need for both floating and fixed polarity DC power supplies. In addition to the two floating DC power sources required by the output section, positive and negative fixed polarity power supplies are needed to operate a differential voltage gain section with direct input coupling. Because standard transformers for analog power supplies typically have a single pair of secondary windings, providing two floating and two fixed polarity DC power supplies generally requires the use of either two standard transformers or a single unit of custom design. Power transformers typically are among the most costly components in an amplifier, so either of these solutions adds significant cost, and may also complicate power supply wiring and fusing.

b) The need for a Class A output stage. Some previous floating bridge amplifier designs using little or no global negative feedback rely on the continuous conduction of both output voltage followers to ensure low overall distortion and consistent control of the voltage across the load. Such continuous conduction, known as class A operation, draws significant current from the power supplies even at idle. This mandates more rigorous and expensive thermal management for the output section, and necessitates the use of heavy-duty power supply components to avoid excessive voltage sag, heating, and noise. These requirements contribute to a design that is more complex and costly to build, and more expensive and inconvenient to operate due to its increased bulk, power consumption, and waste heat.

c) The requirement to isolate the voltage gain section from power supply noise and modulation in order to maintain high linearity and low noise. Some previous floating bridge designs simplify power supply requirements by operating one or more amplifier voltage gain stages from the floating output stage power supplies through passive decoupling networks and bootstrap circuits. The decoupling networks offer effective noise isolation at the cost of reduced operating voltage, potentially limiting the maximum output signal swing. The problem of limited signal swing is overcome by adding resistive bootstrap circuits, but these circuits couple power supply noise and modulation into the signal path, and thus work against the goal of high open-loop performance.

Thus, it is apparent that the use of floating bridge amplifier systems in audio, while highly desirable, still entails significant limitations and drawbacks. The present invention provides a floating bridge amplifier system that largely overcomes these impediments and provides additional benefits, as further described below.

Several objects of the present invention are:

To provide a floating bridge amplifier system whose power requirements can be met by a power transformer of standard design, i.e., one having a single pair of independent secondary windings.

To provide a floating bridge amplifier system in which the signal path is kept linear and the output substantially free of power supply noise and modulation effects.

To provide a floating bridge amplifier system whose output section exhibits distortion and load control comparable to or better than a class A output section, but with lower idle current, heat, bulk, and cost than a class A amplifier.

Further objects and advantages of this invention will become apparent from the following descriptions of the preferred embodiments.

SUMMARY

A floating bridge amplifier system of the present invention includes a pair of DC power supplies, a current gain output section, and a differential voltage gain input section that draws operating current from the DC power supplies through floating DC current regulators. These current regulators effectively isolate the voltage gain section from power supply noise and modulation while creating an operating current loop for the voltage gain section that is independent of ground, allowing for the establishment of positive and negative operating voltages for the voltage gain section. Cross-coupled interstage loading provides a low-noise bootstrap that enables nearly rail-to-rail output voltage swing while forming a local corrective feedback loop around the output section. This local feedback yields improved distortion and load control without the need for a class A output stage or high global negative feedback. In addition, the floating operation of the current regulators improves their performance by minimizing voltage fluctuations across them which can modulate their output currents.

DRAWINGS

DETAILED DESCRIPTION

Figure 1:
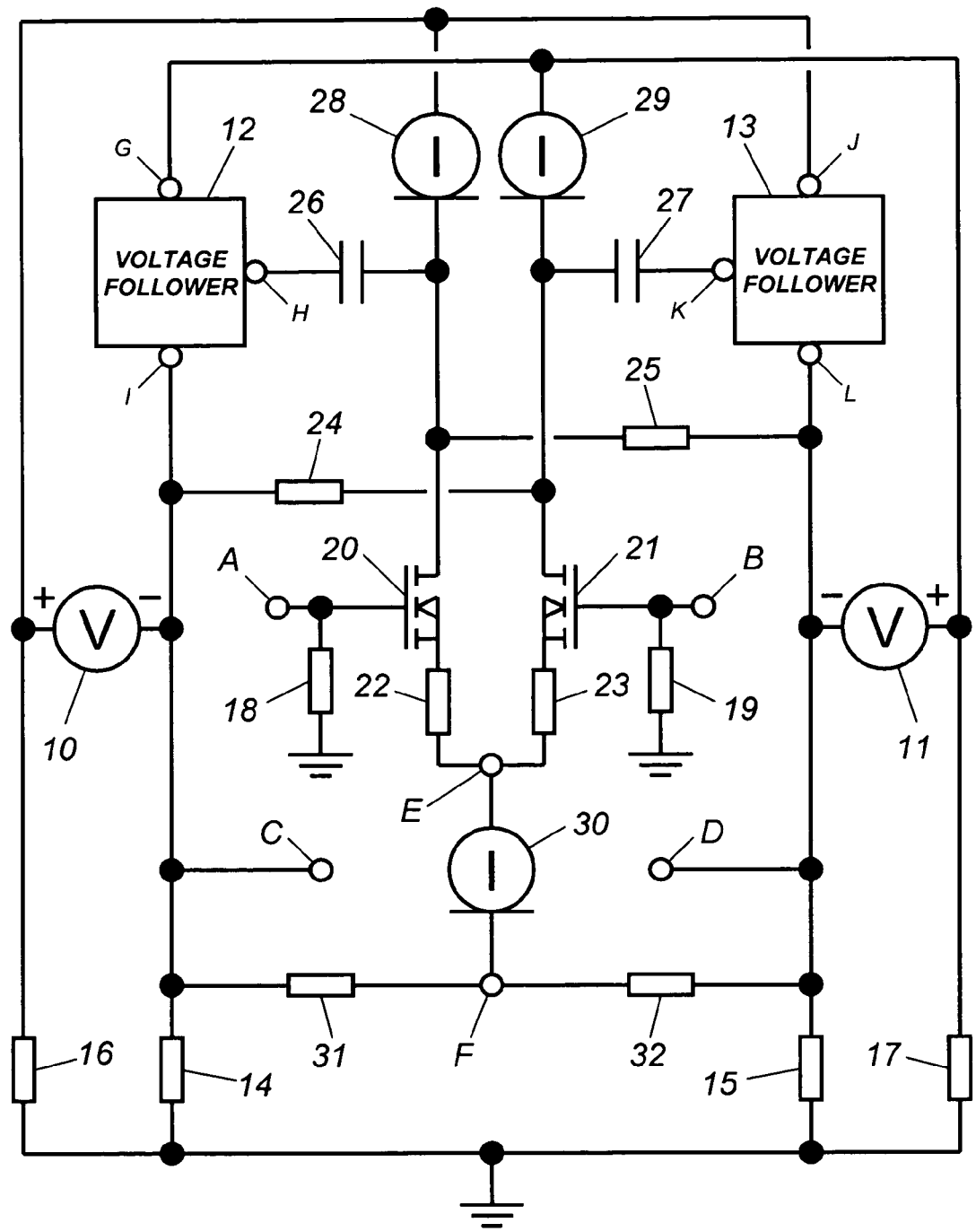
FIG. 1 is a basic schematic diagram of a floating bridge amplifier system of the invention.

The schematic of FIG. 1 shows a preferred embodiment of the amplifier system. Operating voltage and current are provided by floating DC power supplies 10,11 and ground-referenced voltage divider networks 14,16 and 15,17. The output current gain section is represented by voltage followers 12,13, each having an input or control terminal H,K, a supply terminal G,J and an output terminal I,L, and being of suitable internal construction to maintain control of the voltage across a load connected at amplifier output terminals C,D. The voltage gain section includes amplifier input terminals A,B, input impedances 18,19, voltage gain devices 20,21, gain impedances 22,23, interstage load impedances 24,25, interstage coupling means 26,27, floating supply current regulators 28,29, floating bias current regulator 30, and current impedances 31,32.

DC power supplies 10,11 may be any sources of reasonably stable DC power capable of providing the required voltage and current for the application. Typically, these power supplies are produced by separately rectifying and filtering the output voltages of an AC power transformer having dual independent secondary winding; however, various other means known in the art could be used. Voltage dividers 14,16 and 15,17 are typically implemented with small power resistors. The ratio of the dividers is chosen to orient the floating power supplies above and below ground so as to provide positive and negative operating voltages for the voltage gain section. Resistors 14 and 15 are equal in value as are resistors 16 and 17, so that the two DC power supplies are balanced relative to each other under no-signal conditions.

Voltage followers 12,13 may be any gain device or circuit that can achieve substantially linear performance in the application. For example, these voltage followers may be configured as shown in my earlier U.S. Pat. No. 6,747,513 (2004), although other configurations are possible.

As shown in FIG. 1, voltage gain is provided by a long-tail pair differential gain stage. In this embodiment, active gain devices 20,21 are enhancement mode N-channel MOSFETs, which require a positive gate-to-source bias voltage. However, the circuit will readily accommodate N-channel JFETs, vacuum tubes, or other devices requiring a negative bias voltage. Bias current regulator 30 is typically an active constant current source device or circuit. Gain impedances 22,23 are typically resistors of equal value that are selected to define the voltage gain of the stage. One resistor is connected to each MOSFET source, and the remaining ends of the resistors are tied together to form supply current node E for connection of bias current regulator 30. Input impedances 18,19, typically resistors in the range of 10 kilohms to 1 megohm, establish the basic input impedance of the amplifier while holding the input terminals at ground under no-signal conditions. Supply current regulators 28,29 typically are also active constant current sources. The steady DC currents flowing through these regulators and bias current regulator 30 isolates the input section signal path from power supply noise and modulation. Interstage load impedances 24,25 are resistors that convert the signal current variations produced by MOSFETs 20,21 to an output voltage and define the basic output impedance of the voltage gain section. These resistors are cross-coupled to amplifier output terminals C,D to provide local degenerative voltage feedback around the output section for reduced distortion and improved output load control. Interstage coupling means 26,27 are preferably capacitors of equal value, chosen in conjunction with the input impedance of the voltage follower output section to establish a single low-frequency cutoff point for the system.

AC interstage coupling is currently preferred for its simplicity and for its ability to isolate the amplifier output terminals from any DC imbalance in the voltage gain section. Direct interstage coupling is also possible, but may require placing a level-shifting device, such as a PNP bipolar transistor or P channel MOSFET, at the point of interstage coupling to accommodate any difference in DC voltage between the voltage gain stage output terminals and the voltage follower input terminals. With direct interstage coupling, attention must also be given to the control of offset voltage across output terminals C,D and to protection against fault conditions that may create such offset voltage.

As can be seen from the schematic, the circuit is symmetrical about an imaginary vertical center line, with each circuit element on the left mirrored by an identical circuit element on the right. This symmetry contributes to performance, as it promotes the cancellation of even-order harmonic distortion products. This distortion cancellation can be enhanced by placing components with matched characteristics opposite each other across the line of symmetry in the circuit.

The process of specifying component values for this topology may be illustrated through the example of a power amplifier capable of 100 watts output into 8 ohms. Such an amplifier must develop a peak voltage across output terminals C,D of 40 volts. Accordingly, power supplies 10,11 are each specified at 48V to allow for head loss and drop under load. The negative operating voltage needed by the voltage gain section is typically about 12V, so voltage divider resistors 14,15 and 16,17 are set to 1000 and 330 ohms, respectively, to orient the power supplies roughly 36V above and 12V below ground.

In the voltage gain section, the value of bias current source 30 is set to operate MOSFETs 20,21 well into the linear portion of their transfer function. Assuming the use of small-signal MOSFETs, a typical bias current value would be 8 mA. Under no-signal conditions, this bias current is shared roughly equally by MOSFETs 20,21. Operating current for MOSFET 20 is supplied by power supply 10 through current source 28, while operating current for MOSFET 21 is supplied by power supply 11 through current source 29. Interstage load resistors 24,25 are typically equal in value, and are chosen together with the value of supply current sources 28,29 to place the drain voltages of MOSFETs 20,21 as high as possible while allowing sufficient operating voltage for the supply current sources. Allowing 12V for the supply current source operating voltage places the MOSFET drain voltages at about 24V, and implies 36V across each interstage load resistor.

Supply current sources 28,29 are each set to roughly 0.75 times the value of bias current source 30. Thus, if bias current source 30 is set to 8 mA, supply current sources 28,29 are set to about 6 mA each. Operating current of about 4 mA is supplied to MOSFET 20 through current source 28, and about 4 mA is supplied to MOSFET 21 through current source 29. This leaves about 2 mA from each supply current source to return to the DC power supplies through resistors 24,25. Accordingly, resistors 24,25 are set to 18 kilohms each to establish the voltage across them at about 36V, bringing the voltage at the drains of MOSFETs 20,21 to roughly 24V as specified above. Once the values of resistors 24,25 are known, gain resistors 22,23 are set to define the voltage gain for the system. This voltage gain is approximately equal to the ratio of the effective value of resistor 24 (or 25) to the effective value of resistor 22 (or 23). The effective value of resistor 24 is roughly half its nominal value due to the effect of degenerative cross-coupling, or about 9 kilohms in this example. For a gain of 20, the effective value of resistor 22 would therefore be 450 ohms. This value is the sum of the nominal resistor value and the internal source resistance of MOSFET 20 in series with it. Assuming an internal source resistance of about 100 ohms, the value of resistor 22 will be in the range of 350 ohms, with the final value found experimentally. In other embodiments using devices such as triode vacuum tubes that have relatively high and linear internal resistances, resistors 22,23 may be omitted as redundant.

With all component values set as described above, an applied input signal of 2 volts peak will result in signal swing of about 40 volts peak across the drains of MOSFETs 20,21. This signal voltage appears again across output terminals I,L of voltage followers 12,13, respectively, and therefore also across amplifier output terminals C,D. To produce this output, the currents in MOSFETs 20,21 need only vary by 50 percent from their no-signal bias values. This is well within the roughly 100 percent current swing possible for a long-tail pair, and ensures that this stage operates with low distortion. Further reduction in distortion may be achieved by reducing the value of supply current sources 28,29 and increasing the values of resistors 24,25 correspondingly, or simply by increasing the value of bias current source 30, in order to increase the idle-to-maximum current ratio of MOSFETS 20,21. However, there are tradeoffs involved here, as higher current ratios and interstage load resistance values will degrade noise performance and increase the need for precise component values.

In order to regulate the shared bias current through MOSFETs 20,21, bias current source 30 is inserted in the return current path between supply current node E and return current node F. Return current node F is the junction of series resistors 31,32 which are tied across amplifier output terminals C,D. These resistors are of equal value and serve to bifurcate the current returning through them to DC power supplies 10,11. The value of these resistors is chosen to produce a low voltage drop while tolerating the maximum output signal voltage on a continuous basis. Because amplifier output terminals C,D move in equal and opposing directions, the voltage at return current node F remains substantially constant with respect to ground. And, because the voltage at supply current node E also remains substantially constant, the voltage across bias current source 30 stays relatively constant as the amplifier output signal varies. Similarly, because supply current sources 28,29 float with the output signal, they experience only the small signal-related voltage fluctuations required to modulate the current in each output voltage follower. These voltage fluctuations are typically an order of magnitude less than would be seen by the supply current sources if they were referenced to conventional fixed polarity power supplies. Because of the finite output impedance of current regulators 28,29,30, the suppression of voltage fluctuations across them enhances their ability to maintain a steady output current despite large swings in the surrounding signal voltage.

The cross-coupling of interstage load resistors 24,25 to output terminals C,D provides roughly 6 dB of negative voltage feedback around the amplifier output section. This local degeneration reduces both output section distortion and output impedance, and improves bilateral output control by causing the drive voltage to each half of the output section to reflect the voltage at both output terminals. As a function of drive voltage rather than output section idle current, this load control can be maintained over a wider range of load impedance values than would be the case for an output section operating class A but without the benefit of cross-coupling.

The connection of resistors 24,25 to the amplifier output terminals rather than to the power supplies or to ground has the further benefit of improving system rejection of power supply noise and modulation. Although voltage dividers 14,16 and 15,17 couple a substantial fraction of any residual power supply noise to the amplifier output terminals, this noise is rejected differentially by the output section due to the floating drive voltages across resistors 24,25, and so does not appear differentially across the load. Power supply noise may, however, appear across these resistors as a result of the finite output impedance of supply current sources 28,29. For this reason, it is important that the output impedance of these current sources be as high as possible across the amplifier passband. If required, additional noise rejection can be achieved by inserting power supply decoupling networks in power supplies 10,11 ahead of the supply current sources.

It will be understood that certain characteristics of the FIG. 1 embodiment restrict its range of possible application. First, the division of the DC operating voltages above and below ground may in some cases require higher DC power source voltages for a given output rating to allow sufficient operating voltage for all three current regulators. Second, because the amplifier output terminals are at a negative potential, the load must either be indifferent to such negative voltage or be isolated from it by a blocking capacitor or other means. Third, while power supply noise cancels differentially at the amplifier output, any such noise still appears from either output to ground, militating against the use of single-ended outputs unless the system is powered from well-regulated DC supplies or batteries.

Figure 2:
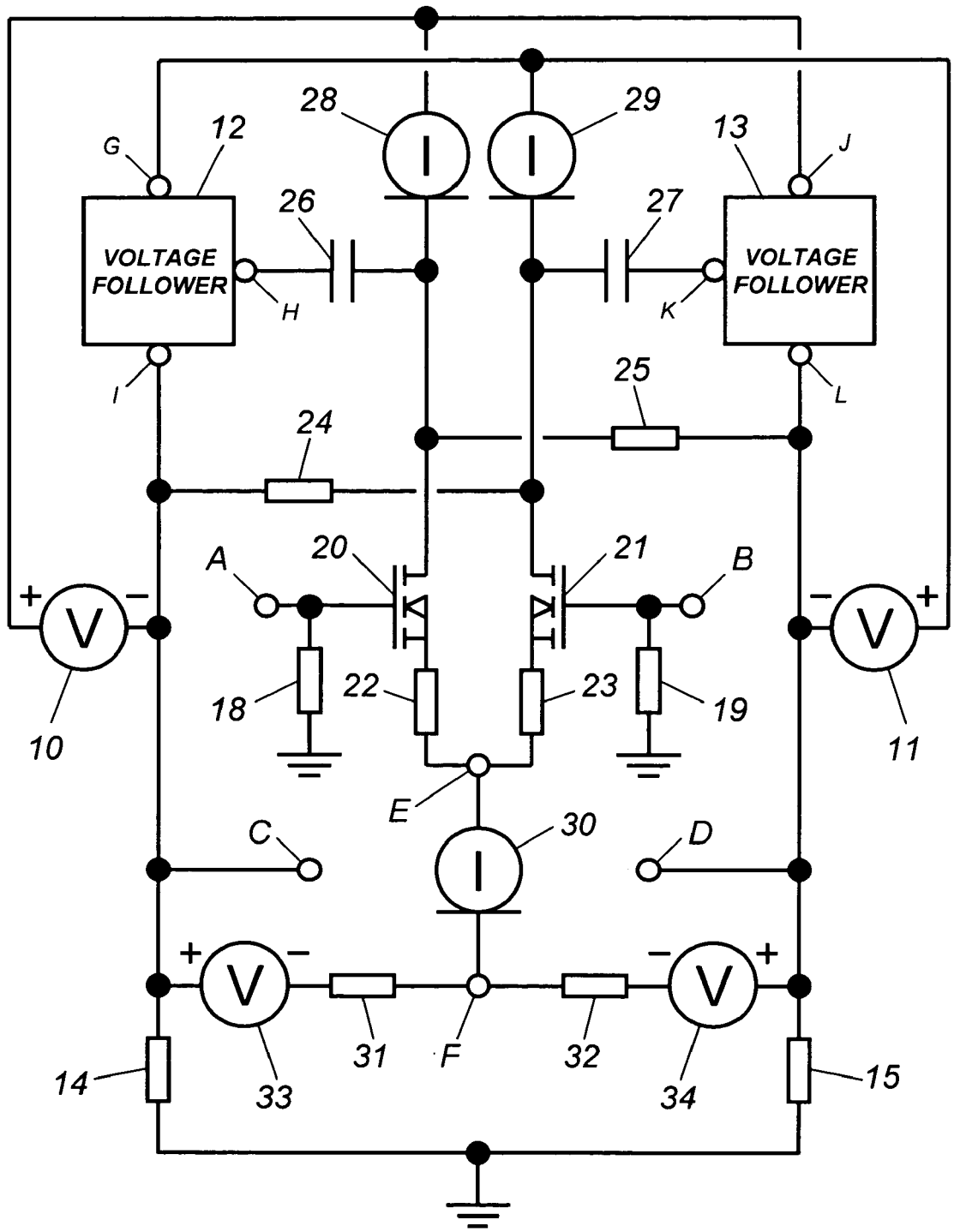
FIG. 2 is a basic schematic diagram of an alternate embodiment of the floating bridge amplifier system of the invention that offers a broader range of application than the FIG. 1 embodiment in exchange for slightly greater power supply complexity.

For applications in which any of these characteristics would make the FIG. 1 embodiment problematic, the alternate embodiment of FIG. 2 is provided. This circuit is identical to that of FIG. 1, except that divider resistors 16,17 are removed and auxiliary floating DC power sources 33,34 are added. Under no-signal conditions, the amplifier output terminals are now held at ground by resistors 14,15. DC power sources 33,34 provide the functional equivalent of a single DC power source in series with bias current source 30, oriented with its negative terminal toward supply current node E and its positive terminal toward return current node F. This provides negative operating voltage for the differential voltage gain stage while allowing output terminals C,D to rest at ground.

The method of providing negative voltage shown in FIG. 2 is preferred because DC power sources 33,34 can be generated without the need for additional transformer secondary windings. For example, these voltages can be provided by an inverting voltage doubler circuit connected to the same secondary windings that feed DC power supplies 10,11. Alternatively, if DC power supplies 10,11 are batteries, DC power sources 33,34 can be implemented by operating an inverting DC-to-DC converter circuit from each power supply.

The method used to generate this additional negative supply voltage is not otherwise critical, and functional equivalents may be used in place of DC power sources 33,34. For example, a single floating DC power supply could be placed in series with bias current source 30. Alternatively, a negative polarity (positive terminal grounded) DC power supply could provide a negative supply rail for current source 30. This would normally create negative offset voltage at the amplifier output terminals; to counteract this, a fourth current source operating from a positive polarity (negative terminal grounded) DC power supply could source a current equal to current source 30 but of opposite polarity into circuit node F, restoring the balance of currents at that node and returning output terminals C,D to ground. This fourth current source could also be made adjustable or equipped with a DC servo circuit to precisely place the output terminals at ground.

The circuits of FIGS. 1 and 2 may be modified to include additional components as dictated by the needs of the application and the electrical characteristics of the chosen components. For example:

Zener diode voltage clamps, fuses, and thermally activated switches may be added to help protect amplifier components, the load, and the user from damage under fault conditions.

MOSFETs may be fitted with series gate resistors (typically 100 to 1000 ohms) to prevent self-oscillation in these components.

Capacitors may be added to limit high frequency response, flatten any "peaking" that may result from phase shifts between the voltage follower input and output terminals, or help to stabilize current regulator circuits that employ loop negative feedback internally.

Decoupling circuits may be added to the DC power supplies, or from return current node F to ground, to provide additional noise filtering for the voltage gain stage and its floating current sources.

Current sources 28,29,30 may be made adjustable to permit tailoring of amplifier clipping level and symmetry.

Such modifications are common practice in amplifier design and are well known to workers skilled in the art. They do not alter the basic operation of the disclosed circuit, and may be made at the discretion of the designer without departing from the spirit and scope of the present invention.

The improved amplifier system topology described in these embodiments provides several advantages and benefits:

All power supply requirements are met by a power transformer of standard design, i.e., one having a single pair of secondary windings.

Effective control of amplifier output voltage is maintained without the need for class A operation of the output section or large amounts of global negative feedback.

The differential amplifier output is substantially free of power supply noise and modulation effects.

Performance is further enhanced by the floating operation of the current regulators, which reduces voltage fluctuations that could modulate current source output.

As has been shown above, the present invention improves upon prior art embodiments by providing a floating bridge amplifier system having simplified power supply requirements, high intrinsic linearity and power supply noise rejection, and effective output load control without requiring a class A output stage or high global negative feedback. The circuit also provides operating conditions that enhance the performance of the current regulators used in it.

While the above description contains many particularities, these should not be construed as limitations on the scope of the invention, but rather as examples of preferred embodiments. Many variations other than those described are possible. For example:

As an alternative to the use of interstage coupling capacitors 26,27, direct interstage coupling could be used.

In a direct interstage coupling embodiment, one or more of the floating current regulators could be configured to sense output voltage or current and thereby help to stabilize output stage bias current or output DC offset voltage, or both.

As an alternative to the use of MOSFETs in the voltage gain section, JFETs, bipolar transistors, or vacuum tubes could be used as voltage gain devices.

In applications requiring that the output stage operate at minimal idle current, a low to moderate amount of global negative feedback could be applied to help control distortion and enhance bilateral load control. In such an embodiment, amplifier open-loop gain could be increased if needed by uncrossing or simply removing interstage load resistors 24,25.

Accordingly, the scope of this invention should be determined not by the embodiments described, but by the appended claims and their legal equivalents.

I claim:

1. A floating bridge amplifier system including
   a. First and second floating DC power sources (10,11) each having a supply terminal and a return terminal;
   b. First and second amplifier output terminals (C,D) for connection to a load, said first output terminal connected to the return terminal of said first DC power source, and said second output terminal connected to the return terminal of said second DC power source;
   c. First and second output impedances (14,15), said first output impedance connected from said first amplifier output terminal to ground, and said second output impedance connected from said second amplifier output terminal to ground;
   d. First and second voltage follower means (12,13) each having an input terminal (H,K), at least one supply terminal (G,J), and an output terminal (I,L), said first voltage follower means having its output terminal connected to said first amplifier output terminal and its at least one supply terminal connected to the supply terminal of said second DC power source, and said second voltage follower means having its output terminal connected to said second amplifier output terminal and at least one supply terminal connected to the supply terminal of said first DC power source;
   e. First and second amplifier input terminals (A,B) for connection to a signal source;
   f. First and second input impedances (18,19), said first input impedance connected from said first amplifier input terminal to ground, and said second input impedance connected from said second amplifier input terminal to ground;
   g. First and second voltage gain devices (20,21) each having an input terminal, a supply terminal, and an output terminal, the input terminal of said first voltage gain device connected to said first amplifier input terminal and the input terminal of said second voltage gain device connected to said second amplifier input terminal;
   h. First and second gain impedances (22,23) connected in series between the supply terminals of said first and second voltage gain devices, the junction of said series connected gain impedances forming a supply current node (E);

i. First and second current impedances (31,32) connected in series between said first and second amplifier output terminals, the junction of said series connected current impedances forming a return current node (F);
j. First, second, and third direct current regulators (28,29, 30), said first direct current regulator connected between the supply terminal of said first DC power source and the output terminal of said first voltage gain device, said second direct current regulator connected between the supply terminal of said second DC power source and the output terminal of said second voltage gain device, and said third direct current regulator connected between said supply current node and said return current node;
k. First and second interstage load impedances (24,25), said first interstage load impedance connected between said first amplifier output terminal and the output terminal of said second voltage gain device, and said second interstage load impedance connected between said second amplifier output terminal and the output terminal of said first voltage gain device;
l. First and second interstage coupling means (26,27), said first interstage coupling means connected between the output terminal of said first voltage gain device and the input terminal of said first voltage follower means, and said second interstage coupling means connected between the output terminal of said second voltage gain device and the input terminal of said second voltage follower means.

2. The amplifier of claim 1 in which said first and second DC power sources are derived from a power transformer having dual independent secondary windings.

3. The amplifier of claim 1 in which said first and second output impedances are resistors.

4. The amplifier of claim 1 in which said first and second input impedances are resistors.

5. The amplifier of claim 1 in which said first and second voltage gain devices are N-channel MOSFETs and in which each input terminal is a gate, each supply terminal is a source, and each output terminal is a drain.

6. The amplifier of claim 1 in which said first and second voltage gain devices are enhancement mode devices.

7. The amplifier of claim 1 in which said first and second gain impedances are resistors.

8. The amplifier of claim 7 in which said first and second gain resistors have a value of zero ohms.

9. The amplifier of claim 1 in which said first and second current impedances are resistors.

10. The amplifier of claim 1 in which said first, second, and third direct current regulators are active constant current source means.

11. The amplifier of claim 1 in which said first and second interstage load impedances are resistors.

12. The amplifier of claim 1 in which said interstage coupling means are capacitors.

13. The amplifier of claim 1 in which said amplifier includes matched circuit elements.

14. The amplifier of claim 1 further including first and second supply impedances (16,17), said first supply impedance connected from the supply terminal of said first DC power source to ground, and said second supply impedance connected from the supply terminal of said second DC power source to ground, said first and second supply impedances forming voltage dividers with said first and second output impedances respectively for the purpose of orienting said first and second DC power sources with respect to ground.

15. The amplifier of claim 14 in which said first and second supply impedances are resistors.

16. The amplifier of claim 1 further including auxiliary DC power means for creating a negative voltage with respect to said first and second amplifier output terminals.

17. The amplifier of claim 16 in which said auxiliary DC power means are third and fourth DC power sources (33,34).

18. The amplifier of claim 16 in which said auxiliary DC power means is not connected directly to ground.

19. A method for incorporating a voltage gain section into a floating bridge amplifier system that simplifies overall amplifier power supply design while maintaining or improving open-loop distortion, noise, and electrical efficiency, consisting of:
a. Providing first and second DC power sources each having a supply terminal and a return terminal;
b. Providing first and second amplifier output terminals for connection to a load, said first output terminal connected to the return terminal of said first DC power source, and said second output terminal connected to the return terminal of said second DC power source;
c. Providing first and second output impedances, said first output impedance connected from said first amplifier output terminal to ground, and said second output impedance connected from said second amplifier output terminal to ground;
d. Providing first and second voltage follower means each having an input terminal, at least one supply terminal, and an output terminal, said first voltage follower means having its output terminal connected to said first amplifier output terminal and its at least one supply terminal connected to the supply terminal of said second DC power source, and said second voltage follower means having its output terminal connected to said second amplifier output terminal and at least one supply terminal connected to the supply terminal of said first DC power source;
e. Providing first and second amplifier input terminals for connection to a signal source;
f. Providing first and second input impedances, said first input impedance connected from said first amplifier input terminal to ground, and said second input impedance connected from said second amplifier input terminal to ground;
g. Providing first and second voltage gain devices each having an input terminal, a supply terminal, and an output terminal, the input terminal of said first voltage gain device connected to said first amplifier input terminal and the input terminal of said second voltage gain device connected to said second amplifier input terminal;
h. Providing first and second gain impedances connected in series between the supply terminals of said first and second voltage gain devices, the junction of said series connected gain impedances forming a supply current node;
i. Providing first and second current impedances connected in series between said first and second amplifier output terminals, the junction of said series connected current impedances forming a return current node;
j. Providing first, second, and third direct current regulators, said first direct current regulator connected between the supply terminal of said first DC power source and the output terminal of said first voltage gain device, said second direct current regulator connected between the supply terminal of said second DC power source and the output terminal of said second voltage gain device, and said third direct current regulator connected between said supply current node and said return current node;

k. Providing first and second interstage load impedances, said first interstage load impedance connected between said first amplifier output terminal and the output terminal of said second voltage gain device, and said second interstage load impedance connected between said second amplifier output terminal and the output terminal of said first voltage gain device;

l. Providing first and second interstage coupling means, said first interstage coupling means connected between the output terminal of said first voltage gain device and the input terminal of said first voltage follower means, and said second interstage coupling means connected between the output terminal of said second voltage gain device and the input terminal of said second voltage follower means.

* * * * *